(12) United States Patent
Johnson, III et al.

(10) Patent No.: US 10,330,304 B2
(45) Date of Patent: Jun. 25, 2019

(54) HEATSINK INCLUDING THICK FILM LAYER FOR UV LED ARRAYS, AND METHODS OF FORMING UV LED ARRAYS

(71) Applicant: Heraeus Noblelight America LLC, Gaithersburg, MD (US)

(72) Inventors: William E. Johnson, III, Burke, VA (US); Darrin Leonhardt, Gaithersburg, MD (US); Mahmood Gharagozloo, Gaithersburg, MD (US)

(73) Assignee: Heraeus Noblelight America LLC, Gaithersburg, MD (US)

( * ) Notice: Subject to any disclaimer, the term of this patent is extended or adjusted under 35 U.S.C. 154(b) by 0 days.

(21) Appl. No.: 15/702,919

(22) Filed: Sep. 13, 2017

(65) Prior Publication Data
US 2018/0080644 A1 Mar. 22, 2018

Related U.S. Application Data

(60) Provisional application No. 62/395,690, filed on Sep. 16, 2016.

(51) Int. Cl.
*F21V 29/60* (2015.01)
*F21K 9/90* (2016.01)
(Continued)

(52) U.S. Cl.
CPC .............. *F21V 29/763* (2015.01); *F21K 9/90* (2013.01); *F21V 29/60* (2015.01); *H01L 33/486* (2013.01);
(Continued)

(58) Field of Classification Search
CPC ........ F21V 29/51; F21V 29/67; F21V 29/673; F21V 29/767; F21V 29/004; F21V 29/006; F21V 29/83; F21V 29/677; F21V 29/71; F21V 29/713; F21V 29/717; F21V 29/763; F21V 29/80; F21V 15/01; F21V 23/005;
(Continued)

(56) References Cited

U.S. PATENT DOCUMENTS 6,469,894 B2 * 10/2002 Ubukata ............. H01L 23/4006
165/104.33
6,945,319 B1 * 9/2005 Li ....................... F28D 15/0275
165/104.33
(Continued)

FOREIGN PATENT DOCUMENTS

| EP | 2421062 | 2/2012 |
|---|---|---|
| WO | 2014118835 | 8/2014 |
| WO | 2015163075 | 10/2015 |

OTHER PUBLICATIONS

International Search Report for International Patent Application No. PCT/US2017/051370 dated Nov. 28, 2017.
(Continued)

*Primary Examiner* — David A Vanore
(74) *Attorney, Agent, or Firm* — Stradley Ronon Stevens & Young, LLP

(57) ABSTRACT

An ultraviolet LED array is provided. The ultraviolet LED array includes a heatsink. The heatsink includes (i) a base heatsink element, and (ii) a thick film layer applied to the base heatsink element. The ultraviolet LED array also includes a plurality of ultraviolet LED elements coupled directly to the thick film layer of the heatsink.

20 Claims, 10 Drawing Sheets

(51) Int. Cl.
*H01L 33/00* (2010.01)
*F21V 29/76* (2015.01)
*H01L 33/48* (2010.01)
*H01L 33/64* (2010.01)
*F21Y 115/10* (2016.01)
*H01L 25/075* (2006.01)
*F21Y 105/10* (2016.01)

(52) U.S. Cl.
CPC ......... *H01L 33/641* (2013.01); *H01L 33/642* (2013.01); *F21Y 2105/10* (2016.08); *F21Y 2115/10* (2016.08); *H01L 25/0753* (2013.01); *H01L 2933/0075* (2013.01)

(58) Field of Classification Search
CPC .. F28D 15/0275; F28D 15/0233; F28D 15/02; F28D 15/0266; F28D 1/32; F28D 1/12; F28D 1/24; F28D 1/02; F28D 1/04; F28D 1/14; F28D 1/20; F28D 1/30; H01L 2924/0002; H01L 2924/00; H01L 2924/00014; H01L 2224/0401; H01L 2224/16225; H01L 2224/73253; H01L 23/367; H01L 23/4006
USPC ... 165/104.21, 104.33, 80.3, 185, 80.2, 151, 165/181, 67; 361/700, 697, 703, 704, 361/709, 719, 679.47, 679.52, 679.54, 361/701, 710; 257/E23.088, E23.102, 88; 250/504 R, 492.1, 522.1, 440.11
See application file for complete search history.

(56) References Cited

U.S. PATENT DOCUMENTS

| | | | | |
|---|---|---|---|---|
| 7,025,125 B2* | 4/2006 | Sheng | ................. | F28D 15/0233 165/104.21 |
| 7,028,758 B2* | 4/2006 | Sheng | ................. | F28D 15/0275 165/104.21 |
| 7,165,603 B2* | 1/2007 | Mochizuki | ............. | F28D 15/02 165/104.21 |
| 7,304,847 B2* | 12/2007 | Hwang | ................... | F28F 1/30 165/104.33 |
| 7,345,320 B2* | 3/2008 | Dahm | ................. | A61C 19/003 165/117 |
| 7,545,646 B2* | 6/2009 | Holmberg | ........... | F28D 15/0266 165/80.2 |
| 7,983,043 B2* | 7/2011 | Xu | ...................... | F28D 15/0233 165/185 |
| 8,508,040 B2* | 8/2013 | Start | .................... | H01L 23/367 257/707 |
| 9,109,784 B2* | 8/2015 | Lee | ........................ | F21V 29/767 |
| 9,441,826 B2* | 9/2016 | Chang | ..................... | F21V 29/51 |
| 9,627,599 B2* | 4/2017 | Lee | ........................ | H01L 33/642 |
| 9,696,024 B2* | 7/2017 | Hoffmann | ............ | F21V 29/673 |
| 9,841,172 B2* | 12/2017 | Watanabe | ............. | F21V 29/673 |
| 9,894,803 B1* | 2/2018 | Artis | ........................ | F28F 1/02 |
| 2004/0035558 A1* | 2/2004 | Todd | ................... | F28D 15/0275 165/104.26 |
| 2004/0135159 A1* | 7/2004 | Siegel | ................. | B41F 23/0409 257/88 |
| 2005/0092465 A1* | 5/2005 | Lin | ..................... | F28D 15/0275 165/104.21 |
| 2006/0286358 A1 | 12/2006 | Tower | | |
| 2009/0084529 A1* | 4/2009 | Huang | ................ | F28D 15/0275 165/104.33 |
| 2011/0100604 A1* | 5/2011 | Anzai | .................... | B21D 53/08 165/104.21 |
| 2012/0098401 A1* | 4/2012 | Yu | ....................... | F28D 15/0275 313/46 |
| 2016/0348887 A1* | 12/2016 | Kobayashi | ............. | B41J 11/002 |
| 2017/0040519 A1 | 2/2017 | Konishi et al. | | |
| 2017/0197001 A1* | 7/2017 | Shito | .......................... | A61L 2/10 |
| 2017/0284650 A1* | 10/2017 | Watanabe | ............ | F21V 29/713 |

OTHER PUBLICATIONS

Markus, John and Schlater, Neil, McGraw-Hill Electronics Dictionary, Fifth Edition, 1994, pp. 538-539, McGraw-Hill, Inc., United States of America.

* cited by examiner

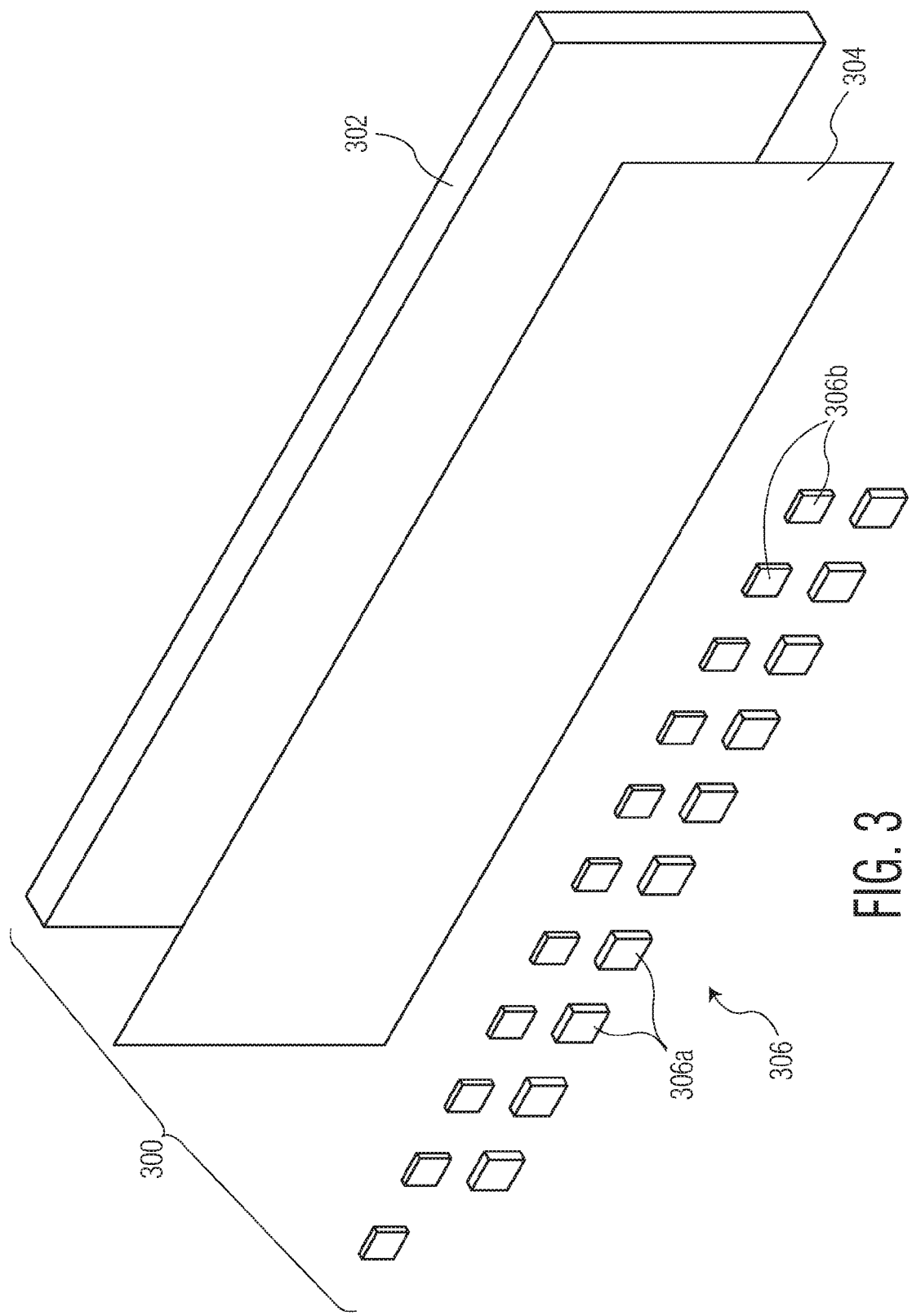

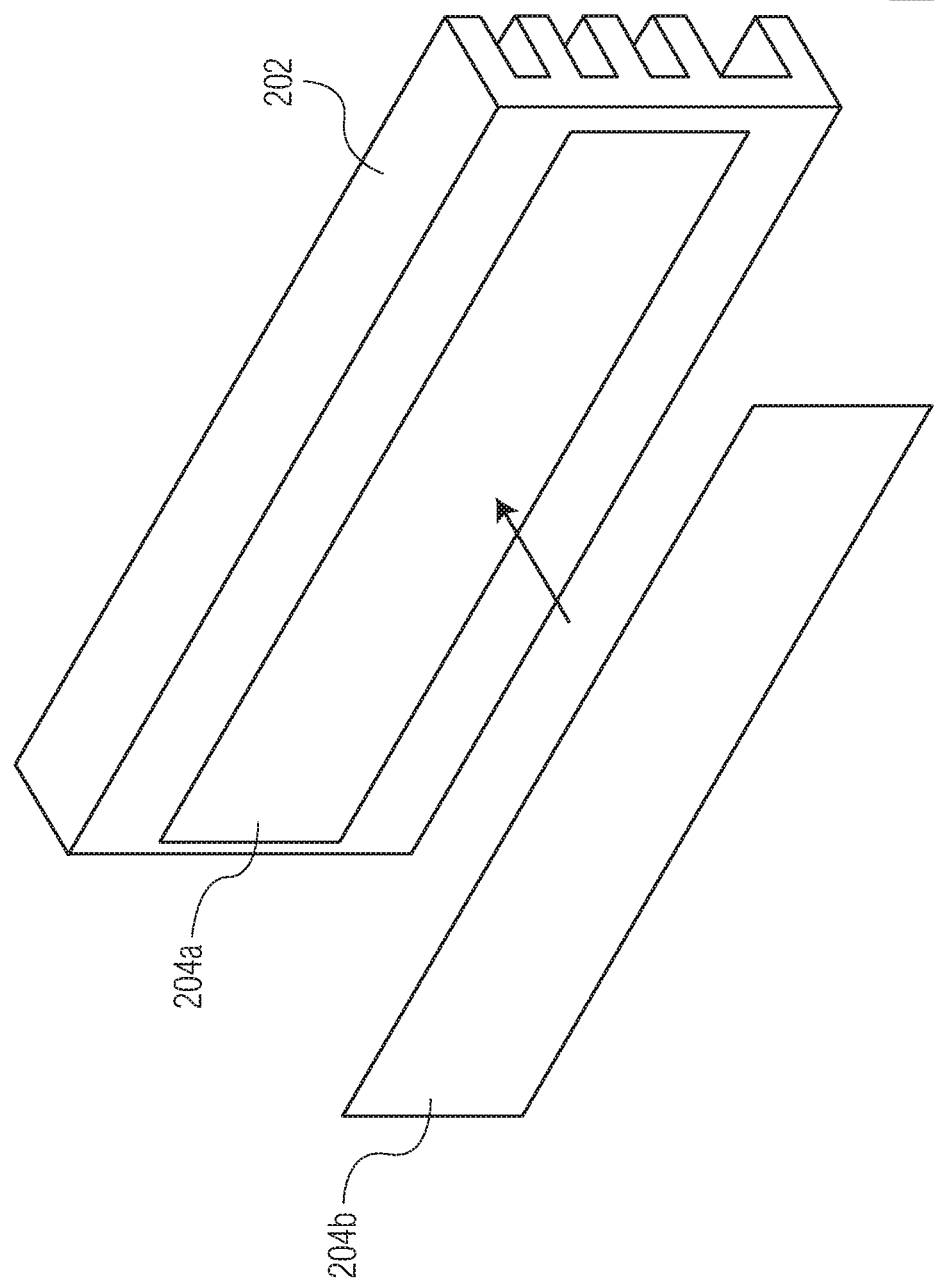

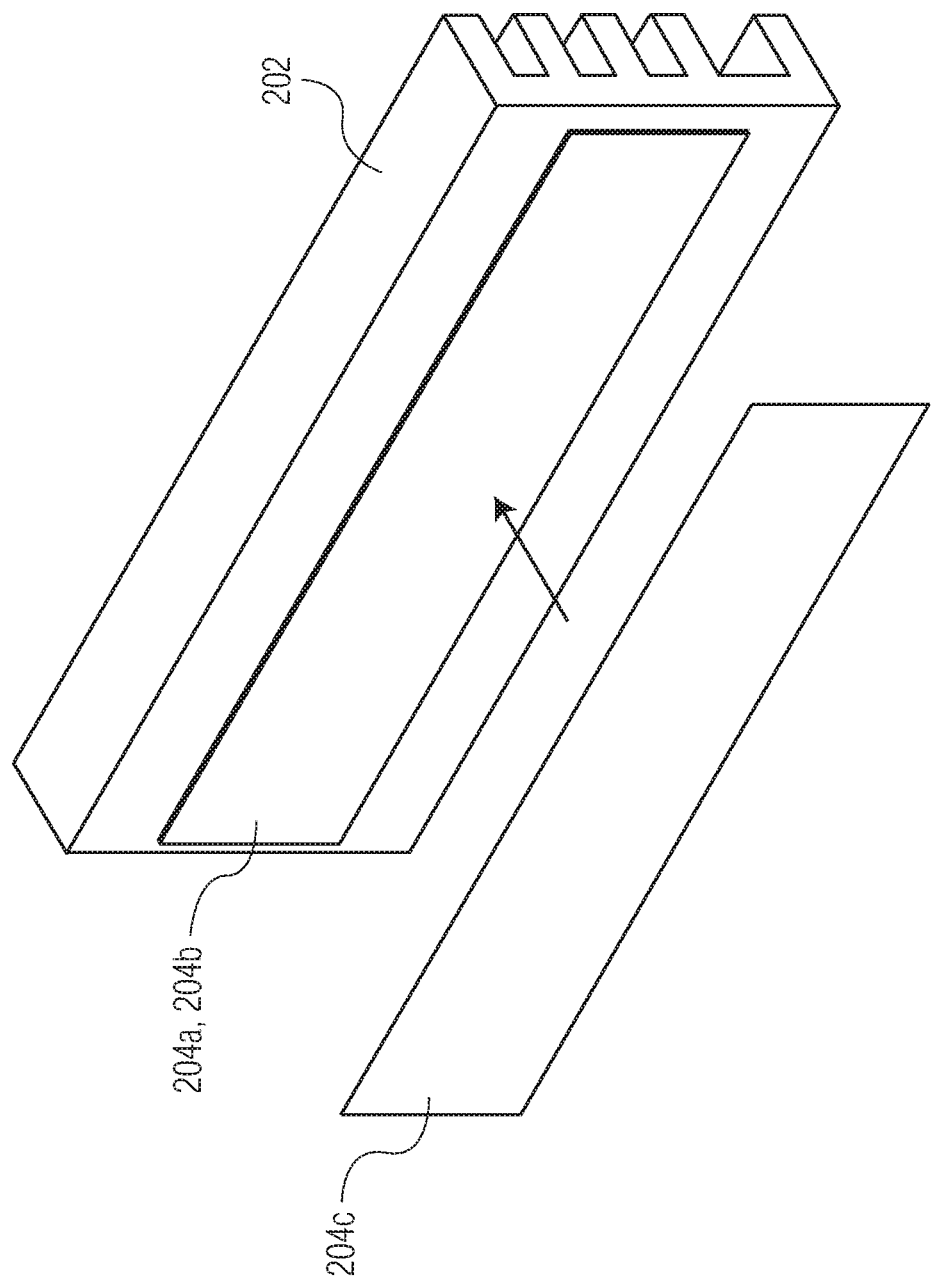

HEATSINK INCLUDING THICK FILM LAYER FOR UV LED ARRAYS, AND METHODS OF FORMING UV LED ARRAYS

CROSS-REFERENCE TO RELATED APPLICATION

This application claims the benefit of U.S. Provisional Patent Application No. 62/395,690, filed Sep. 16, 2016, the contents of which are incorporated herein by reference.

FIELD

The invention relates to substrates for ultraviolet light emitting diode (UV LED) arrays, and more particularly, to heatsinks including thick film layers for UV LED arrays.

BACKGROUND

Ultraviolet radiation LEDs (also known as UV LEDs, or ultraviolet LEDs) are used in connection with many applications such as, for example, ultraviolet curing applications (e.g., ultraviolet curing of inks, bonding agents such as adhesives, coatings, etc.). The UV LEDs, which may be termed UV LED die (e.g., bare UV LED die, packaged UV LED die, etc.), are attached to a substrate to form a ultraviolet LED array (also referred to as a UV LED array).

One challenge in ultraviolet LED array applications is the removal of heat from the array. A heatsink is typically used in connection with the removal of heat. An ultraviolet LED array 100, including a conventional heatsink configuration, is illustrated in FIG. 1.

In the configuration of FIG. 1, a plurality of ultraviolet LED die 112 (shown as a group) are attached to a substrate 110 (e.g., an FR4 substrate, an aluminum nitride substrate). A solder paste layer 108 (e.g., an indium layer) is provided between substrate 110 and a gold plated copper plate 106. A thermal pad 104 is provided between gold plated copper plate 106 and a heatsink 102. Heatsink 102 may be, for example, an aluminum heatsink including fins for air cooling.

Because of the various layers included in ultraviolet LED array 100 of FIG. 1, a relatively high thermal resistance exists—thereby making heat removal from the ultraviolet LED die 112 to heatsink 102 undesirably inefficient.

Thus, it would be desirable to provide improved heatsinks for ultraviolet LED arrays.

SUMMARY

According to an exemplary embodiment of the invention, a ultraviolet LED array is provided. The ultraviolet LED array includes a heatsink. The heatsink includes (i) a base heatsink element, and (ii) a thick film layer applied to the base heatsink element. The ultraviolet LED array also includes a plurality of ultraviolet LED elements coupled directly to the thick film layer of the heatsink.

According to another exemplary embodiment of the invention, a method of forming an ultraviolet LED array is provided. The method includes: (a) selectively applying a thick film layer to a surface of a base heatsink element; (b) firing the base heatsink element, and the thick film layer applied to the base heatsink element, to form a heatsink; and (c) attaching a plurality of ultraviolet LED elements directly to the thick film layer of the heatsink.

According to yet another exemplary embodiment of the invention, another method of forming an ultraviolet LED array is provided. The method includes: (a) selectively applying a thick film dielectric layer to a surface of a base heatsink element; (b) selectively applying a thick film conductive layer to the thick film dielectric layer applied to the surface of the base heatsink element in step (a); (c) selectively applying a solder mask layer to the thick film conductive layer applied to the surface of the thick film dielectric layer in step (b); and (d) attaching a plurality of UV LED elements to the solder mask layer.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 3 is an exploded perspective view of another ultraviolet LED array in accordance with another exemplary embodiment of the invention;

FIGS. 4A-4E are a series of block diagrams illustrating the assembly of the ultraviolet LED array of FIG. 2.

DETAILED DESCRIPTION

As used herein, the terms "ultraviolet LED element" and "UV LED element" are intended to be broadly construed to refer to any ultraviolet LED light producing element including but not limited to a ultraviolet LED die (e.g., a bare die, a packaged die, etc.) to be connected to a substrate. In accordance with exemplary embodiments of the invention, ultraviolet LED elements are attached directly to a heatsink (e.g., using a solder paste) such that the heatsink acts as the substrate. The heatsink may be part of an air cooled ultraviolet LED lamp head.

Figure 1:
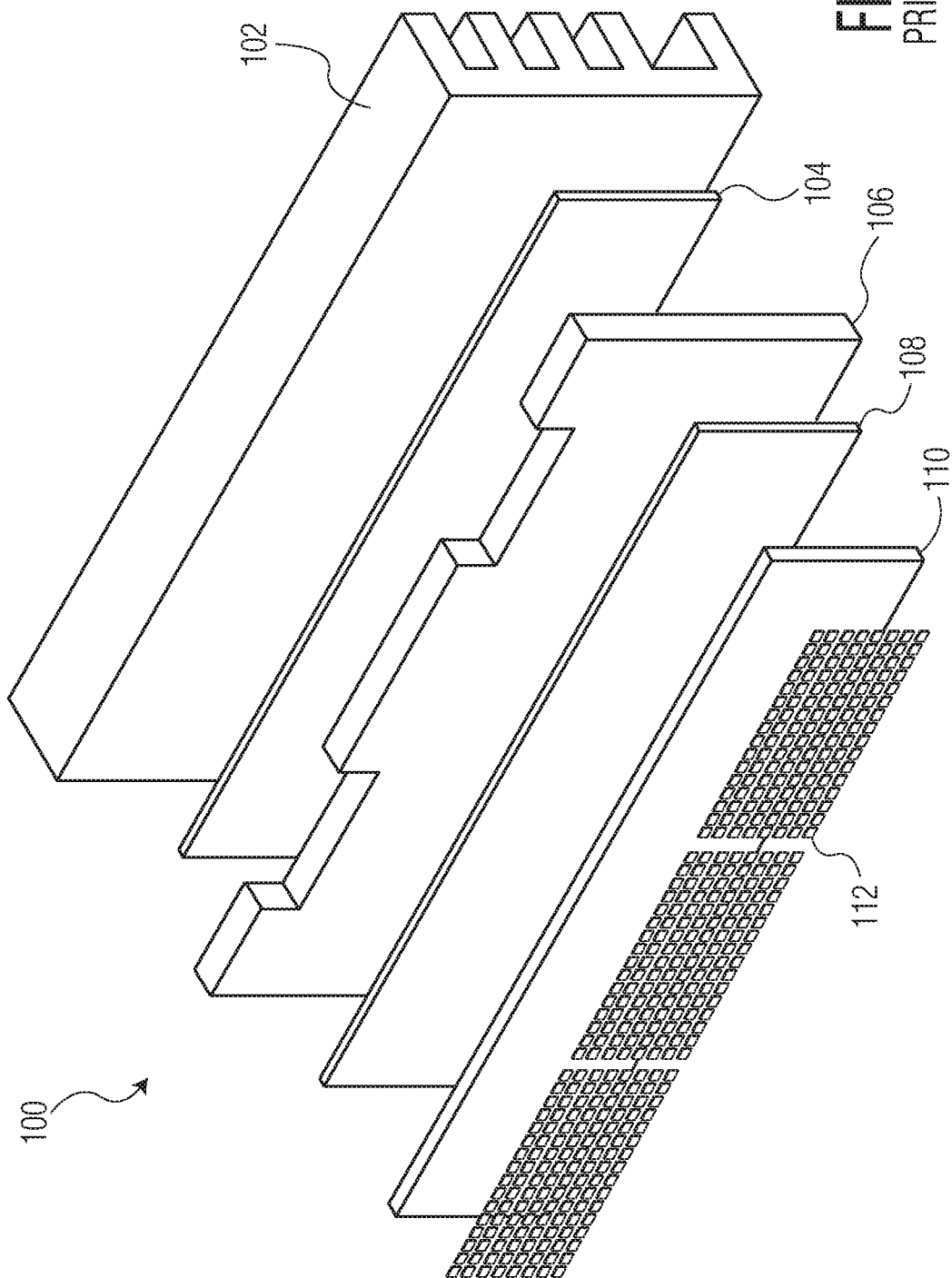
FIG. 1 is an exploded perspective view of a conventional ultraviolet LED array.

That is, in accordance with certain exemplary embodiments of the invention, conductive and insulating pastes provide the thermal, insulating and electrical properties for an air cooled ultraviolet LED lamp head. Thick film technology may be used to simplify the construction of an ultraviolet LED array as compared to the conventional construction such as shown in FIG. 1. Using thick film deposition techniques, a monolithic structure may be created which combines the heatsink and the substrate to which ultraviolet LED elements are attached. Such a monolithic structure provides a low thermal resistance, allowing for the efficient removal of heat using the heatsink (e.g., an air cooled heatsink).

The improved heatsink/substrate offers improved mechanical, thermal and electrical paths as compared to the conventional construction such as shown in FIG. 1. Using the inventive techniques, a more efficient method of assembling an ultraviolet LED array, with fewer parts, and an improved thermal path, is provided. The thick film paste applied to a base heatsink element (e.g., where the base heatsink element may be formed from aluminum or other heatsink material) may desirably have a coefficient of thermal expansion very close to (or substantially equivalent to) that of the base heatsink element. By the coefficient of thermal expansion of the thick film layer (which may be applied to the base heatsink element as a series of layers) being similar to the base heatsink element, risk of failure of the device (including solder joints in the device) is reduced.

Figure 2:
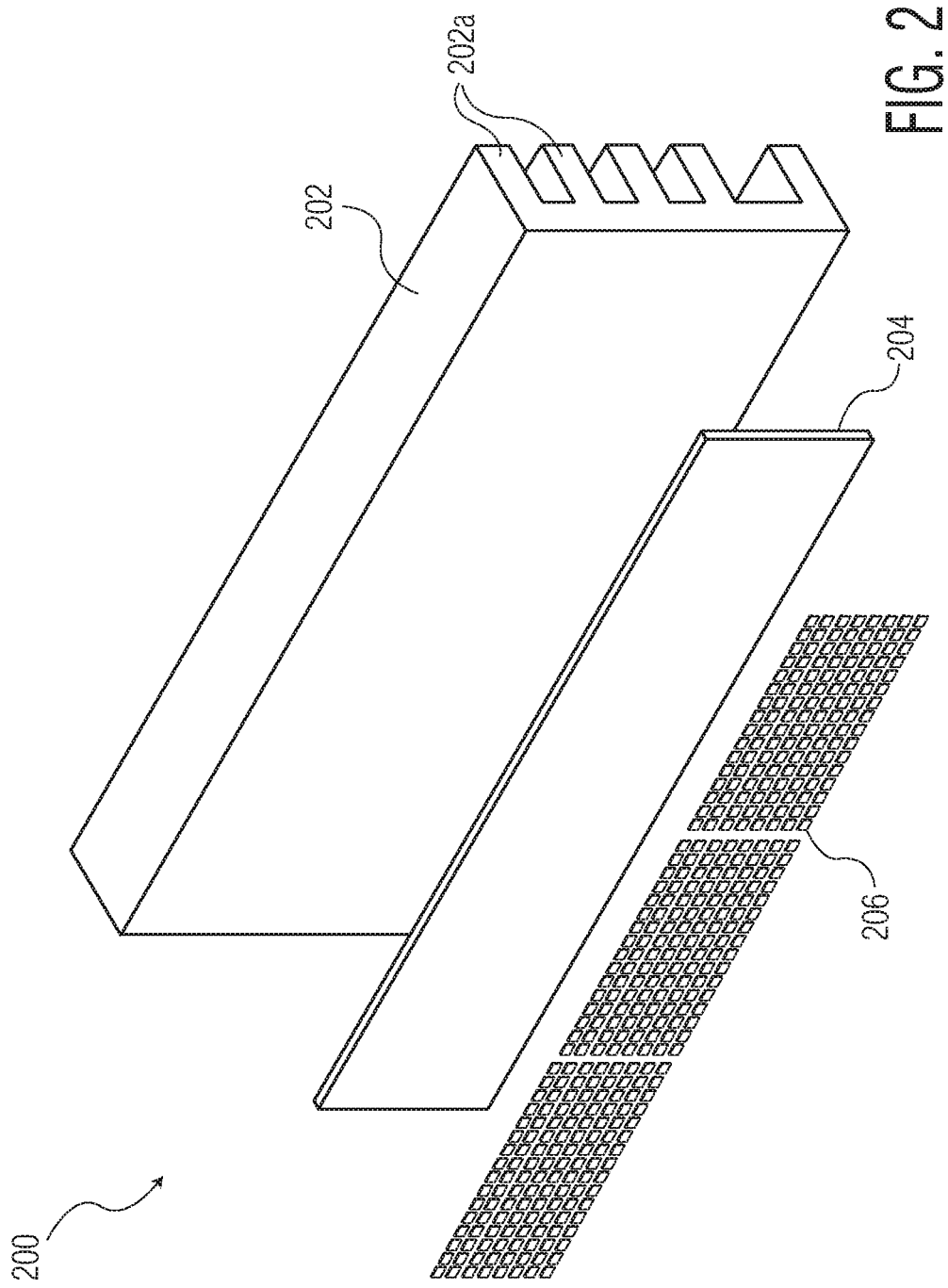
FIG. 2 is an exploded perspective view of an ultraviolet LED array in accordance with an exemplary embodiment of the invention.

FIG. 2 illustrates an ultraviolet LED array 200 in an exploded view. Ultraviolet LED array 200 includes a heatsink including a base heatsink element 202 (e.g., an aluminum element including cooling ridges or fins 202a for air cooling or the like) and a thick film layer 204 to be applied to the surface of base heatsink element 202 closest to the die attach LEDs 206 (i.e., a plurality of ultraviolet LED elements to be applied to the heatsink such as bare ultraviolet LED die elements or packaged ultraviolet LED die elements). The thick film layer 204 may selectively be applied, for example, using printing (e.g., screen printing, silk screen printing, etc.) techniques or the like. As will be explained in greater detail below, thick film layer 204 may be applied in a series of layers through multiple printing steps and/or other processing steps.

In FIG. 2, the plurality of ultraviolet LED elements 206 are shown as a group; however, it will be appreciated that the plurality of ultraviolet LED elements 206 may be applied in any desired manner (e.g., one element at a time, multiple elements at a time in a "gang" bonding or attach process, etc.). FIG. 2 illustrates thick film layer 204 to be applied between the plurality of ultraviolet LED elements 206 and the base heatsink element 202.

FIG. 3 illustrates another exemplary configuration of an inventive ultraviolet LED array 300. Ultraviolet LED array 300 includes a base heatsink element 302, which may be formed of aluminum or another material appropriate for a heatsink. While FIG. 3 illustrates a simplified base heatsink element, it is understood that the base heatsink element may have any desired configuration such as including air cooled ridges/fins or the like. A thick film layer 304 is to be selectively applied to the base heatsink element, for example, using a screen printing technique. The thick film layer 304 may be printed to have the desired conductive paths, for example, such that the printed conductive paths/traces align with the plurality of ultraviolet LED elements to be attached to the heatsink.

After the thick film layer 304 is applied to the base heatsink element 302, and then cured/fired (e.g., in an oven or the like), a heatsink is provided. The heatsink is configured to act as a substrate configured to receive a plurality of ultraviolet LED elements 306. The ultraviolet LED elements 306 are attached to the heatsink (i.e., the thick film portion of the heatsink) using solder paste 306b. As illustrated in FIG. 3, the solder paste 306b may be applied to a backside of each of the ultraviolet LED elements prior to attachment to the heatsink.

Figure 4A:
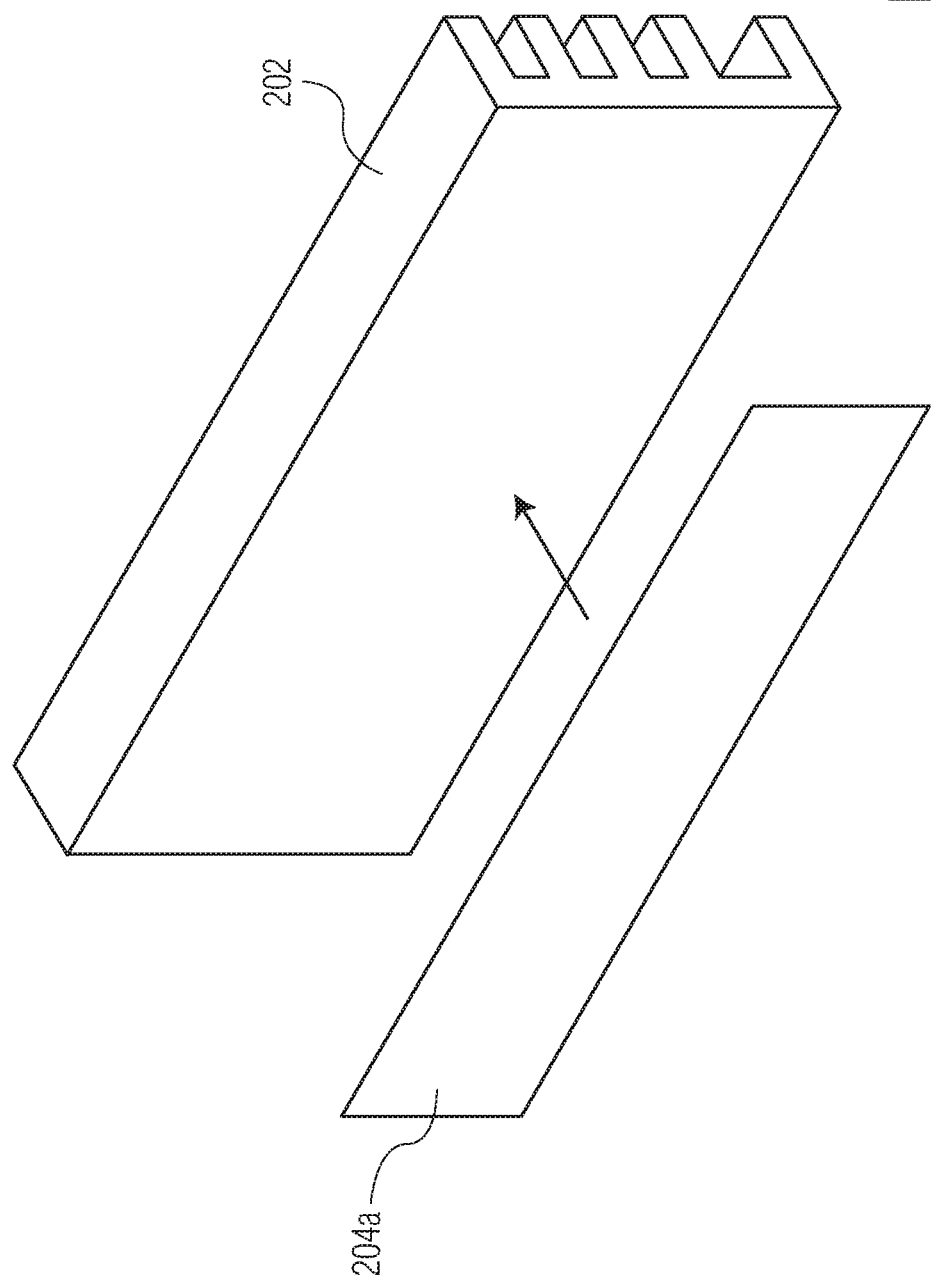

FIGS. 4A-4E are a series of block diagrams illustrating an exemplary approach for assembling an ultraviolet LED array 200 (such as array 200 shown in the exploded view of FIG. 2) in accordance with aspects of the invention. In FIG. 4A, a base heatsink element 202 is provided. A dielectric layer 204a is applied to the surface of base heatsink element 202, for example, using a screening process (e.g., a silk screening process, etc.). After application of dielectric layer 204a in FIG. 4A, a conductive layer 204b is applied, as shown in FIG. 4B. For example, conductive layer 204b may be applied onto dielectric layer 204a (which has been applied to base heatsink element 202), using a screening process (e.g., a silk screening process, etc.). After application of conductive layer 204b in FIG. 4B, a solder mask layer 204c is applied, as shown in FIG. 4C. For example, solder mask layer 204c may be applied onto conductive layer 204b (which has been applied to dielectric layer 204a, which has been applied to base heatsink element 202), using a screening process (e.g., a silk screening process, etc.).

Figure 4D:
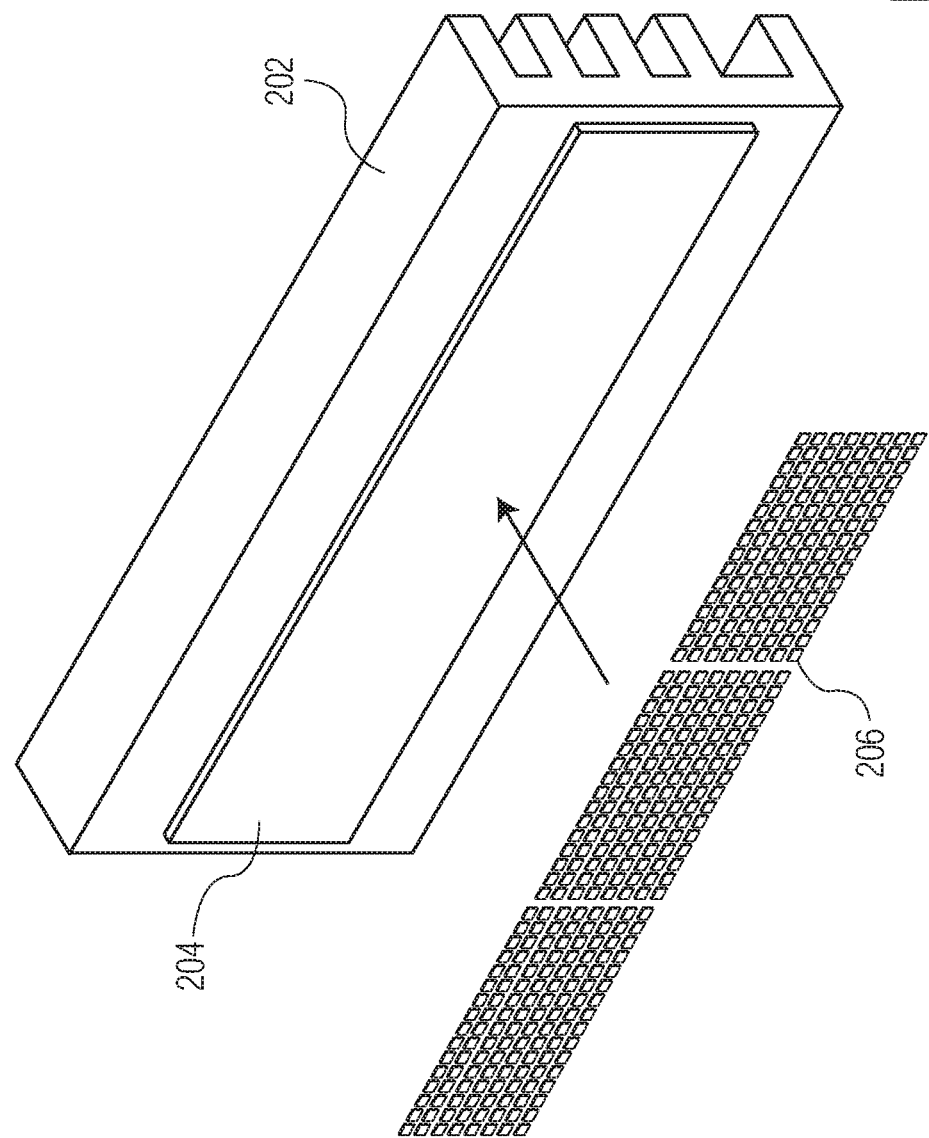
Figure 4E:
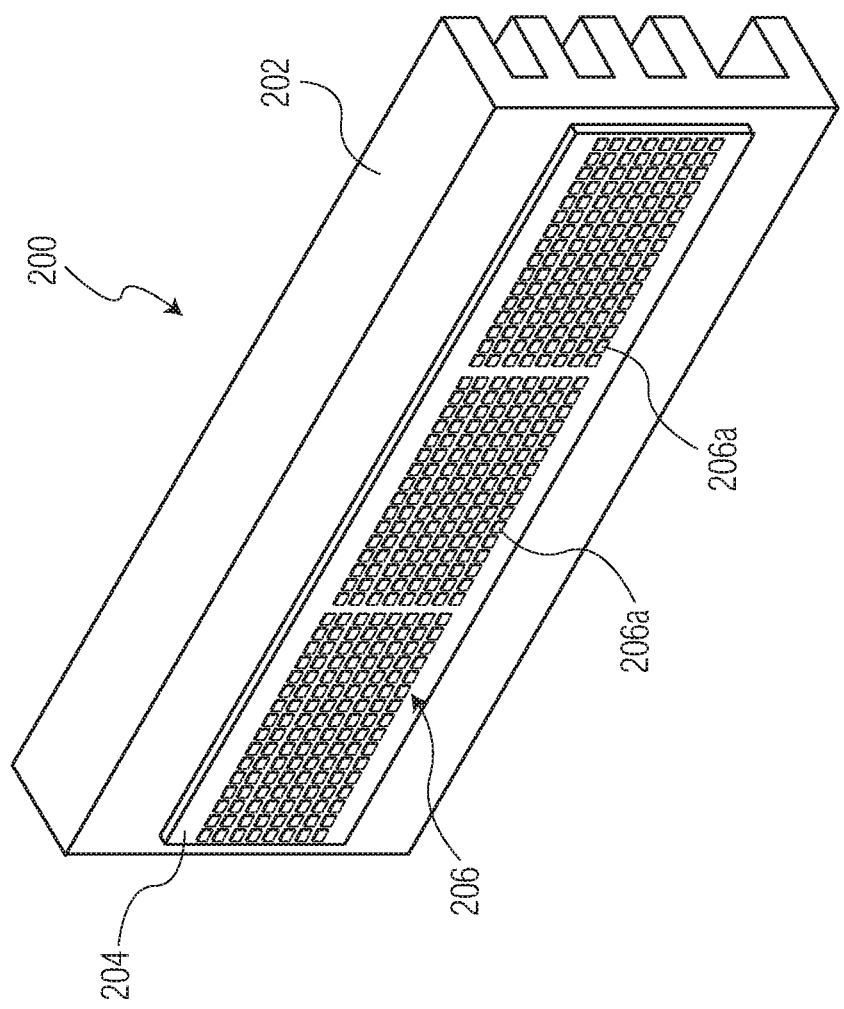

After application of the three layers comprising the exemplary thick film (i.e., dielectric layer 204a, conductive layer 204b, and solder mask layer 204c), the heatsink (including the base heatsink element 202, and the three applied layers 204a, 204b, and 204c) may be cured/fired (e.g., in an oven or the like) such that the three layers 204a, 204b, and 204c form what is now referred to as thick film layer 204 (e.g., see FIG. 4D). Then, as shown in FIG. 4D, a plurality of ultraviolet LED elements 206 are applied onto the now cured thick film layer 204. Ultraviolet LED elements 206 (which may include solder paste, not shown for simplicity) may be applied in any desired manner (e.g., in a pick and place process one element at a time, in a gang bonding/attached process, etc.). FIG. 4E illustrated the fully assembled ultraviolet LED array 200, including the (i) heatsink (including base heatsink element 202 and the thick film layer 204 applied to the base heatsink element) and (ii) the plurality of ultraviolet LED elements 206.

Figure 5:
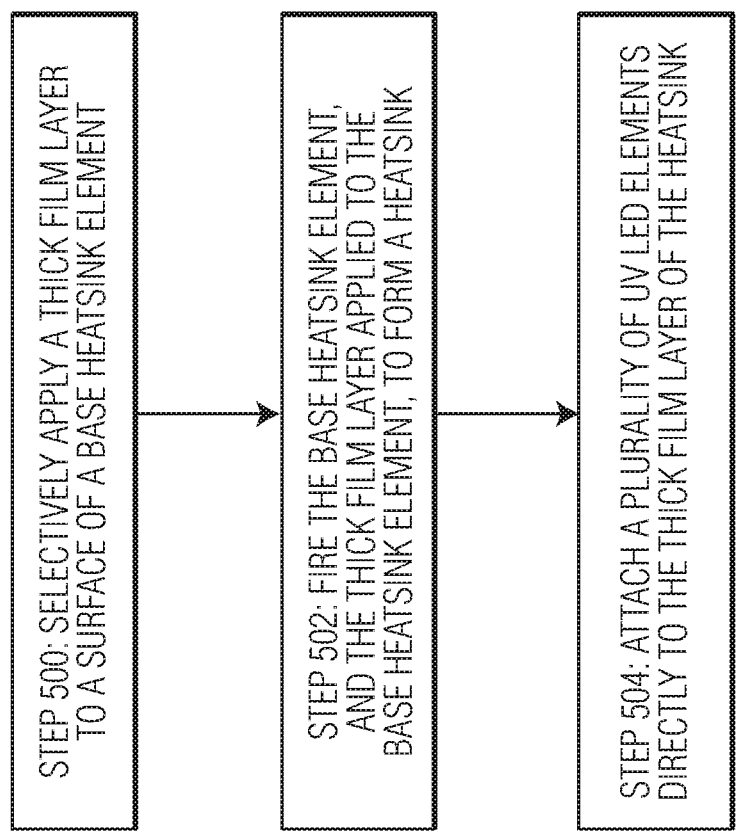
FIGS. 5-6 are flow diagrams illustrating methods of assembling ultraviolet LED arrays in accordance with exemplary embodiments of the invention.
Figure 6:
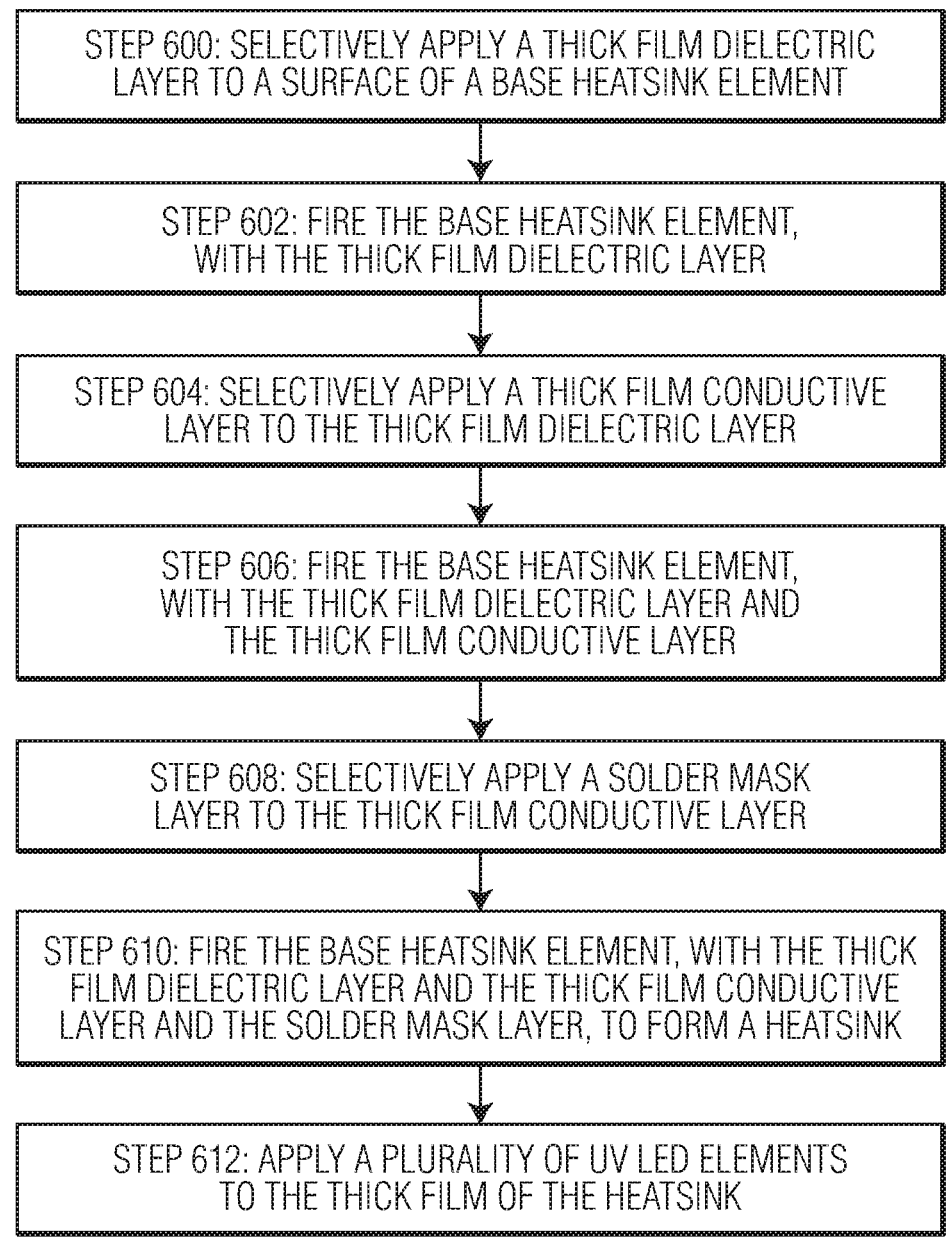

FIGS. 5-6 are flow diagrams in accordance with certain exemplary embodiments of the invention. As is understood by those skilled in the art, certain steps included in the flow diagram may be omitted; certain additional steps may be added; and the order of the steps may be altered from the order illustrated.

FIG. 5 illustrates a method of forming an ultraviolet LED array is provided. At Step 500, a thick film layer is selectively applied (e.g., using screen printing or the like) to a surface of a base heatsink element (e.g., an aluminum heatsink elements including cooling ridges/fins for air cooling). For example, the thick film layer may be applied using the techniques described above in connection with FIGS. 4A-4D. At Step 502, the base heatsink element, and the thick film layer applied to the base heatsink element, are fired to form a heatsink. Thus, a monolithic structure (such as the heatsink shown in FIG. 4D including base heatsink element 202 and thick film layer 204), which will act as a substrate (to receive a plurality of ultraviolet LED elements) and a heatsink (to remove heat generated by the plurality of ultraviolet LED elements) is provided. At Step 504, a plurality of ultraviolet LED elements (such as ultraviolet LED elements 206 shown in FIG. 4D) are attached directly to the thick film layer of the heatsink, for example, using a solder paste (e.g., an indium solder paste).

FIG. 6 illustrates another method of forming an ultraviolet LED array. At Step 600, a thick film dielectric layer is selectively applied to a surface of a base heatsink element (e.g., see layer 204a being applied to a surface of base heatsink element 202 in FIG. 4A). At Step 602, the base heatsink element, with the thick film dielectric layer applied thereto, is fired (e.g., cured in an oven or the like). At Step 604, a thick film conductive layer is selectively applied to the thick film dielectric layer that was applied to the surface of the base heatsink element in Step 600 (e.g., see layer 204b being applied to layer 204a in FIG. 4B). At Step 606, the base heatsink element, with the thick film dielectric layer and the thick film conductive layer applied thereto, is fired (e.g., cured in an oven or the like). At Step 608, a solder mask layer is selectively applied to the thick film conductive layer that was applied to the thick film dielectric layer in Step 604 (e.g., see layer 204c being applied to layer 204b in FIG. 4C). At Step 610, the base heatsink element, with the thick film dielectric layer and the thick film conductive layer and the solder mask layer applied thereto, is fired (e.g., cured in an oven or the like). After Step 610 is completed, a heatsink has been formed including the base heatsink element (e.g., element 202 shown in FIG. 4A) and the thick film layer applied thereto (e.g., thick film layer 204 including layers 204*a*, 204*b*, and 204*c* in FIGS. 4A-4C). At Step 612, a plurality of UV LED elements are attached to thick film of the heatsink (e.g., applied to thick film layer 204 in FIG. 4E). Specifically, the plurality of UV LED elements may be considered as being directly attached to the solder mask layer (or to the thick film layer through the solder mask layer of the thick film layer).

A number of benefits are achieved through the various exemplary embodiments of the invention. An initial benefit is provided in that certain of the assembly pieces utilized in conventional ultraviolet LED array assembly may be omitted. A monolithic structure, where the heatsink functionality, as well as the substrate functionality, are combined into a single heatsink element, thereby allowing for improved mechanical, thermal, and electrical paths. Specifically, improved thermal performance compared to conventional heatsink interfaces is provided, for example, because the inventive interfaces may have a substantially reduced thickness (e.g., on the order of mils versus micrometers).

The paste used to form the thick film layer may desirably have a coefficient of thermal expansion very close to that of the base heatsink element (e.g., close to the coefficient of thermal expansion of aluminium). The thick film technology may be applied, for example, using industry-standard techniques for pcb fabrication, and therefore may be mass produced and even automated. Such a simplified fabrication approach is a sharp contrast to the "multilayer stack" in conventional designs that require significant manual steps to bond layers together.

Testing of conventional ultraviolet LED arrays (such as shown in FIG. 1), as compared to inventive ultraviolet LED arrays (such as shown in FIGS. 2-4), illustrates certain improved characteristics of the inventive ultraviolet LED arrays. For example, when the same current and voltage are applied to the array of FIG. 1 versus the arrays of FIGS. 2-4, the peak temperature of the inventive arrays is much lower (e.g., about 20° C. lower) than the conventional arrays. Such lower temperatures allows the inventive ultraviolet LED arrays to be operated at a higher power output (and consequently a higher ultraviolet output from the ultraviolet LED array).

It will be appreciated by those skilled in the art that certain details regarding the ultraviolet LED arrays is omitted in the application for simplicity. For example, the ultraviolet LED arrays will include electrical contact regions (e.g., traces, pads, etc.) for each of the ultraviolet LED elements on the heatsink.

Although the invention is illustrated and described herein with reference primarily to ultraviolet LED array assembly, it is not limited thereto. For example, the teachings of the invention also have application to high current driver assemblies that utilize thermal management.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An ultraviolet LED array comprising:
    a heatsink, the heatsink including (i) a base heatsink element, and (ii) a thick film layer applied to the base heatsink element, the thick film layer including a dielectric layer applied to the base heatsink element, a conductive layer applied to the dielectric layer, and a solder mask layer applied to the conductive layer, wherein the heatsink including the base heatsink element and the thick film layer is a monolithic structure; and
    a plurality of ultraviolet LED elements coupled directly to the thick film layer of the heatsink.

2. The ultraviolet LED array of claim 1 wherein the plurality of ultraviolet LED elements coupled directly to the thick film layer of the heatsink using a solder paste.

3. The ultraviolet LED array of claim 2 wherein the solder paste includes indium.

4. The ultraviolet LED array of claim 1 wherein the plurality of ultraviolet LED elements coupled directly to the thick film layer of the heatsink using conductive epoxy.

5. The ultraviolet LED array of claim 1 wherein the base heatsink element is aluminum.

6. The ultraviolet LED array of claim 1 wherein a coefficient of thermal expansion of the base heatsink element and the thick film layer are substantially the same.

7. The ultraviolet LED array of claim 1 wherein the thick film layer is applied to the base heatsink element using a screening process.

8. The ultraviolet LED array of claim 7 wherein the heatsink, including the base heatsink element and the thick film layer, are fired after application of the thick film layer to the base heatsink element.

9. The ultraviolet LED array of claim 1 wherein the ultraviolet LED array is an air cooled UV LED lamp head.

10. The ultraviolet LED array of claim 1 wherein the plurality of ultraviolet LED elements are bare semiconductor die LED elements.

11. The ultraviolet LED array of claim 1 wherein the plurality of ultraviolet LED elements are packaged semiconductor die LED elements.

12. A method of forming an ultraviolet LED array, the method comprising the steps of:
    (a) selectively applying a thick film layer to a surface of a base heatsink element;
    (b) firing the base heatsink element, and the thick film layer applied to the base heatsink element, to form a heatsink; and
    (c) attaching a plurality of UV LED elements directly to the thick film layer of the heatsink.

13. The method of claim 12 wherein step (c) includes attaching the plurality of UV LED elements directly to the thick film layer of the heatsink using a solder paste.

14. The method of claim 12 wherein step (c) includes attaching the plurality of UV LED elements directly to the thick film layer of the heatsink using a solder paste including indium.

15. The method of claim 12 wherein step (c) includes attaching the plurality of UV LED elements directly to the thick film layer of the heatsink using a conductive epoxy.

16. The method of claim 12 wherein step (a) includes selectively applying the thick film layer to the surface of the base heatsink element using a screening process.

17. The method of claim 12 wherein the formed ultraviolet LED array is an air cooled UV LED lamp head.

18. The method of claim 12 wherein step (a) includes applying the thick film layer to the surface of the base heatsink element through a series of steps including (a1) applying a dielectric layer to the surface of the base heatsink element, (a2) applying a conductive layer to the dielectric layer, and (a3) applying a solder mask to the conductive layer.

19. The method of claim 12 wherein the plurality of ultraviolet LED elements attached in step (c) are bare semiconductor die LED elements.

20. A method of forming an ultraviolet LED array, the method comprising the steps of:
   (a) selectively applying a thick film dielectric layer to a surface of a base heatsink element;
   (b) selectively applying a thick film conductive layer to the thick film dielectric layer applied to the surface of the base heatsink element in step (a);
   (c) selectively applying a solder mask layer to the thick film conductive layer applied to the surface of the thick film dielectric layer in step (b); and
   (d) attaching a plurality of UV LED elements to the solder mask layer.

\* \* \* \* \*